United States Patent
Basawapatna et al.

(10) Patent No.: US 8,749,282 B1
(45) Date of Patent: Jun. 10, 2014

(54) TRANSLATIONAL PHASE LOCK LOOP AND SYNTHESIZER THAT ELIMINATES DIVIDERS

(71) Applicants: Ganesh Ramaswamy Basawapatna, Greenwood Village, CO (US); Varalakshmi Basawapatna, Greenwood Village, CO (US); Anand Ganesh Basawapatna, Greenwood Village, CO (US); Ashok Ram Basawapatna, Greenwood Village, CO (US)

(72) Inventors: Ganesh Ramaswamy Basawapatna, Greenwood Village, CO (US); Varalakshmi Basawapatna, Greenwood Village, CO (US); Anand Ganesh Basawapatna, Greenwood Village, CO (US); Ashok Ram Basawapatna, Greenwood Village, CO (US)

( * ) Notice: Subject to any disclaimer, the term of this patent is extended or adjusted under 35 U.S.C. 154(b) by 0 days.

(21) Appl. No.: 13/732,612

(22) Filed: Jan. 2, 2013

(51) Int. Cl.
 H03L 7/18 (2006.01)
 H03L 7/093 (2006.01)
(52) U.S. Cl.
 USPC .......................................... 327/156; 327/147
(58) Field of Classification Search
 CPC .......... H03L 7/0891; H03L 7/18; H03L 7/093
 USPC .................................. 327/147, 156
 See application file for complete search history.

(56) References Cited

U.S. PATENT DOCUMENTS

| | | | | |
|---|---|---|---|---|
| 3,273,073 A * | 9/1966 | Cutler | ............................... | 331/38 |
| 3,320,546 A * | 5/1967 | Allen et al. | ....................... | 331/22 |
| 6,526,265 B1 * | 2/2003 | Damgaard et al. | ............. | 455/118 |
| 6,617,932 B2 * | 9/2003 | Kushner et al. | ................. | 331/11 |
| 6,952,569 B2 * | 10/2005 | Damgaard et al. | ............. | 455/118 |
| 8,373,463 B1 * | 2/2013 | Chenakin | ....................... | 327/156 |
| 8,552,773 B2 * | 10/2013 | Thomas | ......................... | 327/156 |
| 8,598,925 B1 * | 12/2013 | Nicholls et al. | ................ | 327/156 |
| 2003/0038682 A1 * | 2/2003 | Kushner et al. | ................. | 331/11 |
| 2003/0139148 A1 * | 7/2003 | Damgaard et al. | ............. | 455/86 |
| 2005/0104668 A1 * | 5/2005 | Hyden et al. | ...................... | 331/16 |
| 2008/0192876 A1 * | 8/2008 | Dulger et al. | .................. | 375/376 |
| 2008/0192877 A1 * | 8/2008 | Eliezer et al. | ................... | 375/376 |
| 2009/0256601 A1 * | 10/2009 | Zhang et al. | ................... | 327/156 |
| 2010/0117693 A1 * | 5/2010 | Lorg et al. | ...................... | 327/156 |
| 2011/0116587 A1 * | 5/2011 | Ryu et al. | ....................... | 375/376 |
| 2012/0306538 A1 * | 12/2012 | Aryanfar et al. | .................. | 327/5 |
| 2012/0313677 A1 * | 12/2012 | Thomas | ......................... | 327/156 |
| 2013/0050013 A1 * | 2/2013 | Kobayashi et al. | ............ | 342/118 |

* cited by examiner

*Primary Examiner* — Adam Houston

(57) ABSTRACT

This invention describes a method by which a low cost low phase noise Phase Locked Loop or Phase Locked Loop based Frequency Synthesizer can be realized. The new method, called a Translational Phase Lock Loop or TPLL, allows the conversion of a traditional voltage controlled oscillator or VCO signal so that the phase noise of the VCO signal is substantially identical to the noise that the loop is aimed to correct via comparison to a low noise reference oscillator. It overcomes additional problems associated with traditional and prior art phase lock loops in terms of unwanted spurious signals, complexity, and cost.

11 Claims, 10 Drawing Sheets

TRANSLATIONAL PHASE LOCK LOOP AND SYNTHESIZER THAT ELIMINATES DIVIDERS

FIELD OF THE INVENTION

This invention pertains to a method to create high purity broadband signals from a low noise tunable source using novel signal processing and synthesis techniques.

DEFINITION OF TERMS

Voltage Controlled Oscillator (VCO): An oscillator whose frequency is controlled by the application of a voltage (or current) to a tuning port.

Phase Lock Loop (PLL): A closed loop system where the output of a VCO is locked to a Reference Oscillator within a certain bandwidth.

TCXO: Temperature Controlled Crystal Oscillator. The Crystal Oscillator output is kept stable by a temperature sensor that is used to electronically control the frequency.

OCXO: Oven Controlled Crystal Oscillator. A heater element is used to control the temperature of the oscillator circuit. Usually provides better stability than a TCXO, but is more expensive.

DDS: A Direct Digital Synthesizer. Is used to create arbitrary time functions as a series of digital steps. Often used to create very accurate sinusoidal functions.

Harmonic Mixer: If F1 and F2 are two frequencies input to a Harmonic Mixer, it will create signals with frequencies of $\pm mF1 \pm nF2$ where m and n are integers.

Switching Speed: In the context of this patent application, the inverse of the time it takes for a synthesizer to change from one phase locked frequency to another.

BACKGROUND OF THE INVENTION

RF and Microwave Frequency Synthesizers are used in many applications including terrestrial communications, satellite communications, electronic warfare and countermeasures, and in instrumentation and systems testing, including in medical and nuclear research. In many of these systems there is a need for high stability signals with high signal purity and the ability to modulate the signals according to various modulation schemes, and to vary the frequencies often over multiple octave frequencies at high switching speeds, all at the lowest possible cost. The signal instabilities are a combination of amplitude and frequency (or phase) instabilities. The latter is often called Phase Noise, and is often a limiting factor in the performance of many systems.

Traditionally, frequency synthesis has been performed using Phase Locked Loops (PLLs) or Direct Digital Synthesis (DDS), and sometimes a combination of both. In both cases, a very stable Reference Oscillator (RO), often a Temperature controlled Crystal Oscillator (TCXO) or an Oven Controlled Crystal Oscillator (OCXO) usually operating at some frequency between 10 MHz and 100 MHz or more with excellent stability and Phase Noise characteristics, is used to provide the reference signal which forms the basis of the synthesized output. The PLL uses a tunable Voltage Controlled Oscillator (VCO) whose output is divided by a loop divider and in a feedback loop, locked to the VCXO or TCXO. A typical configuration is shown in FIG. 1, which is described in greater detail in the next section. The DDS uses the TCXO or VCXO as an accurate clock to generate a time function that approximates the sinusoidal output of an oscillator in a series of steps.

Current State of the Art PLLs such as the one shown in FIG. 1, divide the VCO frequency ($F_{vco}/N$) until it equals the RO frequency. Here N is not necessarily an integer. For example, with a 10 MHz RO and a 8567.3 MHz VCO, the value of N would be 856.73. The loop is closed via a low pass filter (LPF) that takes the difference between the RO and $F_{vco}/N$, filters it, and uses the output to fine-tune the VCO. Within the bandwidth of the PLL, which is mostly (but not totally) defined by the LPF, the phase noise of $F_{vco}/N$ will track the phase noise of the RO so long as the loop gain is sufficiently large. The problem is that by dividing the VCO frequency by N, the magnitude of the phase noise is also reduced by a factor of N, i.e., 20 logN dB. The VCO phase noise will therefore be 20 logN worse than the RO within the loop bandwidth, and have the same characteristics as a free running VCO outside the loop bandwidth.

While this approach often gives meaningful and sufficient reduction in phase noise for use in many systems, in many other systems it does not. Also, achieving non-integer values of N requires techniques that result in spurious sidebands that are generated and often cannot be suppressed. At the same time DDS technology has not progressed to the extent of providing a usable alternative at 5 GHz and above at an acceptable cost or with usable integrated circuit chips. The present invention provides a meaningful solution to this performance divide by using an architecture that eliminates the "divide by N" issue in PLLs.

SUMMARY OF THE INVENTION

This invention creates a unique solution to the problem described above. The fact that a PLL assures that the loop adheres to the phase noise of the RO is in itself not sufficient to assure a compliant phase noise spectrum at the output. It is necessary that the VCO signal presented to the phase detector to be compared to the RO have the same noise characteristics as the VCO and not as $F_{vco}/N$. When the VCO frequency is divided by N, its phase noise improves by 20 logN, so that the loop is not correcting the VCO phase noise but only a fraction of it. In other words, if we have a 10 MHz RO with excellent phase noise, to achieve similar performance from a phase locked VCO, it is necessary to have a signal at 10 MHz with the SAME phase noise characteristics as the VCO presented at the phase detector for comparison.

As can be appreciated by anyone familiar with the art, this is not easy. To provide a signal to the phase detector at the same frequency as the RO, but with the same phase noise characteristics as the VCO over possibly multi-octave or decade bandwidths has been heretofore considered extremely expensive if not impossible.

This invention resolves the problem. It recognizes that if the VCO output were to be mixed with a signal of much higher purity than the VCO itself, so that one of the resultant frequencies was at the RO frequency, and this resultant frequency was filtered out ($F_{mixer}$), then the $F_{mixer}$ signal would have the same phase noise characteristics as the VCO within a much lower margin of difference, and the PLL would assure that the VCO output tracked RO rather than RO+20 log N. We call this a Translational PLL or TPLL.

Our invention is aimed at solving the two biggest issues associated with prior art by doing exactly this. It is non-intuitive, but it is simple and effective.

Prior art attempts to solve this same issue have involved using multiple frequency multipliers and dividers in order to provide the same effect. They involve the necessity to build two loops to achieve the goal, a first loop that is a traditional loop that sets the VCO at the frequency where it needs to be, and then a second loop that provides a frequency translation $F_{mixer}$ that can only then be brought into the picture. Our approach needs only one loop, is faster to lock, is more accurate, and costs less.

This is demonstrated in the detailed description of the invention that follows. Our invention provides almost all the advantages of the DDS and the PLL, while eliminating all their disadvantages. It allows the cleanup of the noisiest aspects of the most typical noisy VCOs.

BRIEF DESCRIPTION OF THE DRAWINGS

The exemplary embodiments are best described by referring to the drawings attached. It should be emphasized that these drawings are for the purpose of explanation only, and do not necessarily reflect actual values of components that can be used. It should be appreciated that the types of components as well as how they are used in a TPLL will vary widely depending on the technology used.

FIG. 5 shows one preferred embodiment of a Translational Mixer that corrects many of the shortcomings of the prior embodiments in actual usage situations.

DETAILED DESCRIPTION OF THE PROBLEM TO BE SOLVED, AND PREFERRED EMBODIMENTS

The invention concepts are herein attempted to be described using the drawings referred to. They do not represent all possible embodiments, but are used for illustrative purposes only. In order to make clear the improvements the present invention creates and the significant difference in approach, we first describe and discuss the prior art.

Figure 1:
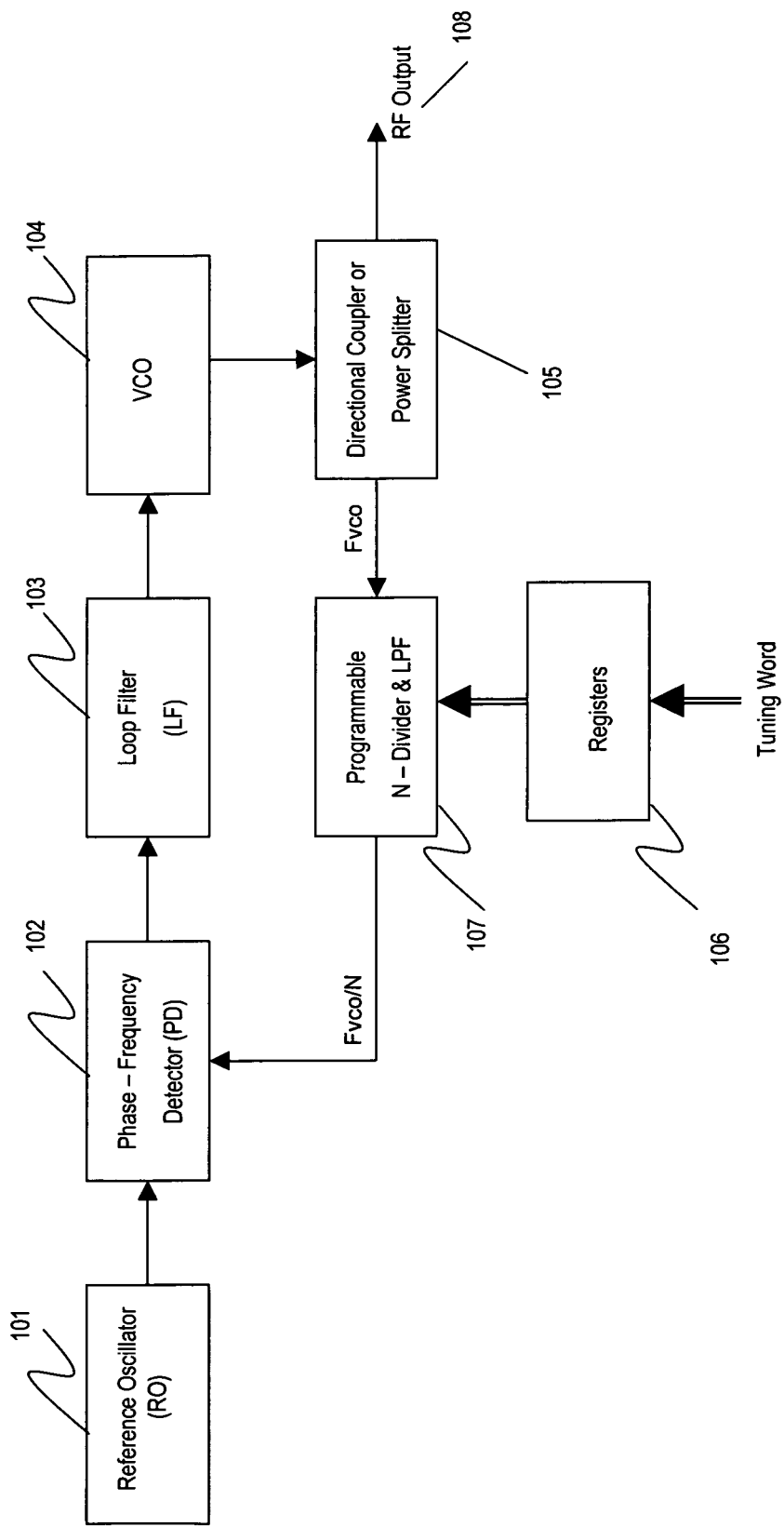
FIG. 1. shows a traditional PLL realization in block diagram form.

FIG. 1 shows a typical PLL synthesizer block diagram. The Reference Oscillator, RO, 101 is typically chosen for its frequency stability and low phase noise. The Phase Frequency Detector (PFD) 102 is a nonlinear device. It creates the product of the RO signal and the $F_{vco}/N$, the low pass filtered (LPF) output of the Programmable Divider 107. When the phase lock loop is locked, the two frequencies Fro and $F_{vco}/N$ are equal, and the baseband component of this product is proportional to the phase difference between the two input signals to the PFD as a function of time. This Error Signal is passed through a Low Pass Filter, often called a Loop Filter 103, and the output used to fine tune the VCO 104. The Loop Filter 103 circuit often incorporates a charge pump in order to increase the loop gain within the loop bandwidth for more effective closed loop control without loop instabilities. The VCO 104 output is sampled by means of the directional coupler 105 and a portion of the VCO output power is input to the programmable frequency divider 107. The "Divide By" number is calculated in the synthesizer registers 108 and used to program the Programmable Divider 107. A frequency command to the registers 108 causes the register to calculate the appropriate division ratio N so that $F_{vco}/N$=Reference Frequency. This is a classic feedback loop configuration where, within the loop bandwidth, the loop attempts to make the Error Signal zero by forcing the $F_{vco}/N$ phase to be the same as the RO phase within the loop bandwidth.

This PLL scheme has gained widespread use due to the availability of components that perform the functions described using for example, Emitter Coupled Logic, ECL or other digital logic ICs. While it allows for significant accuracy and stability and considerable reduction of the VCO phase noise within the loop bandwidth, it has many drawbacks. First, as earlier stated, the RO phase noise is compared to $F_{vco}/N$. This means that even within the loop, the VCO phase noise at any offset frequency within the Loop Bandwidth is 20 logN dB worse than the RO. Second, to achieve the desired frequency resolution, the VCO frequency needs to be divided by non-integer or fractional numbers. This is usually done by a method whereby the fractional portion of the division is approximated by the ratio of two integers, and this ratio is implemented by having two values of division done by the defined fraction number of cycles. For example, if the fraction is 7/10, every 7 of 10 cycles a numerically incremented division ratio is done or omitted according to the algorithm. While this works well to some specified accuracies, it also creates discrete spurious frequency sidebands to be generated, often outside the Loop Bandwidth where such spurious signals cannot be suppressed by the loop. In many systems using these synthesizers, such so-called Fractional Spurs cannot be tolerated as they cause modulation errors or adjacent channel or other interference.

Figure 2:
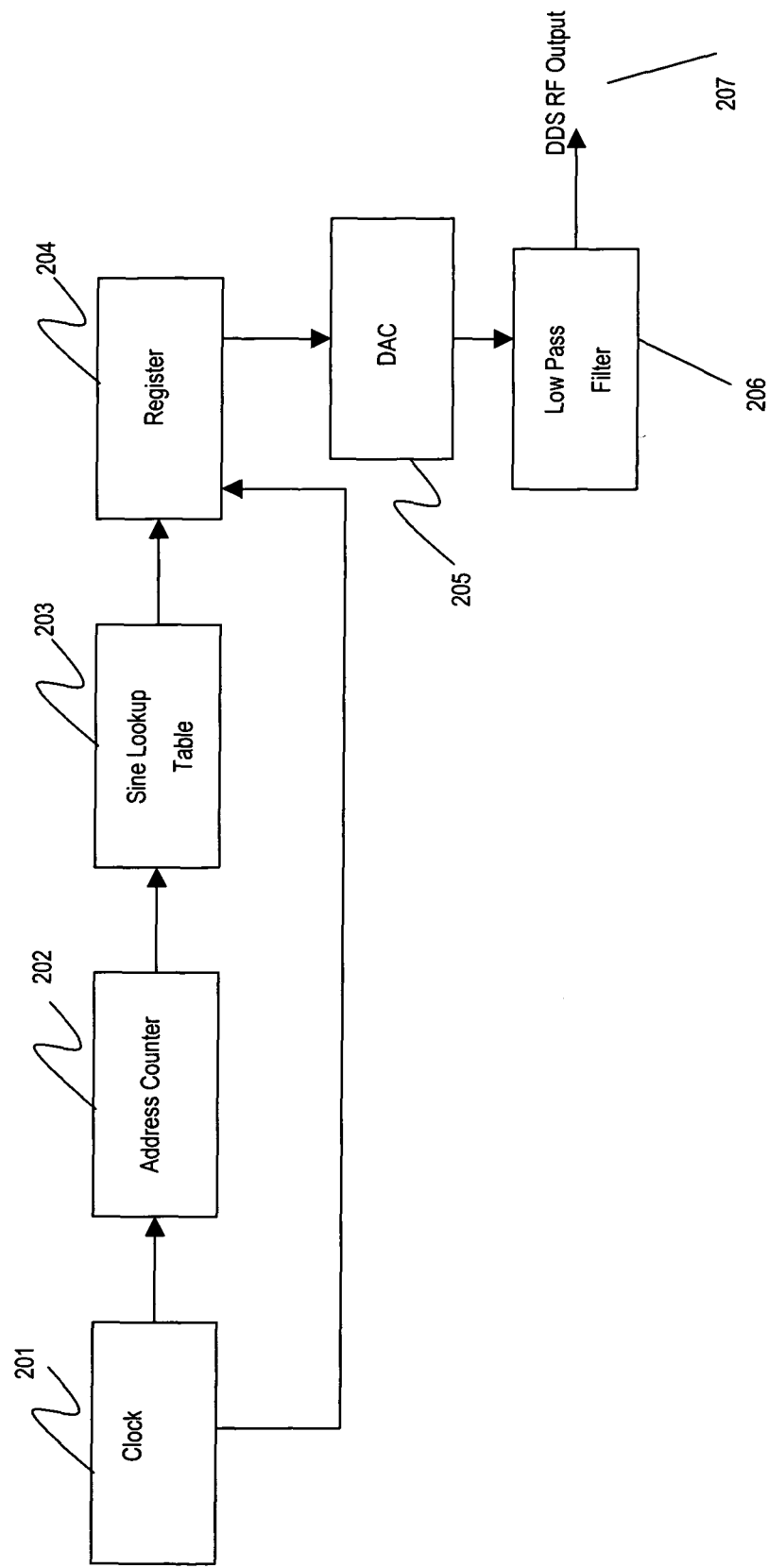
FIG. 2 shows a typical DDS Synthesizer in block diagram form.

FIG. 2 demonstrates a typical Direct Digital Synthesizer, DDS block diagram. In a typical DDS the desired time function of the output signal is created by approximating the desired output current or voltage as a function of time by using a stepped output versus time approximation algorithm. The duration of each step is controlled by a Reference Clock 201. The address counter 202 determines where in the desired function the signal presently is, and the Lookup Table 203 determines the next voltage or current value as a digital word. In the example shown, a sine function lookup table is employed to create a sinusoidal output signal. This is clocked into the Register 204, whose output drives a DAC 205, which generates a staircase function that approximates the desired analog output time function. A Low Pass Filter 206 attempts to create a time continuous output.

The DDS has significant advantages. It can create arbitrary time functions. When the lookup table is loaded with a sine or cosine function, it can, with enough processing bits, create an almost exact sine or cosine waveform. It can change phase continuously, which a traditional PLL cannot. DDSs can be created that have perfect in phase and quadrature outputs, as needed in many communication systems, over very wide frequency ranges of output. However, the DDS architecture does suffer from many limitations, most of them imposed by current state of the art in high speed integrated circuit processing. First and foremost is the limitation imposed by Nyquist Sampling Theorem. The maximum frequency that a DDS can output with good fidelity is less than half its clock frequency. While discrete DDS systems with 10 or more Gigasamples Per Second (GSPS) have been created, present state of the art limits commercially available chip devices to a few GSPS. Presently, this means that DDS synthesizers can reliably be built at reasonable cost and size upto less than 2 GHz. Another limitation arises from the fact that the chain of pulses created at the clock frequency, when Fourier Transformed, produce a sin x/x frequency spectrum that appears as sidebands to the DDS output. Methods exist for suppressing these spurs and other quantization spurs caused in the DDS, but the fact is that they do exist and the closer the DDS output frequency is to the clock frequency the more pronounced these effects are.

To summarize and quantify the two approaches mentioned above with some practical numbers, the PLL architecture of FIG. 1 has significant disadvantages due to the division ratio. With a 10 MHz crystal oscillator as reference and a 10 GHz VCO frequency, the VCO output, divided by 1000 improves the VCO phase noise by 20 log 1000 or 60 dB before comparing with the RO at the PFD. The division effectively causes the VCO phase noise improvement to be 60 dB worse due to the division ratio. Also there can exist disturbingly large numbers of fractional spurs which need many tricks to minimize, and cannot easily be eliminated. The DDS architecture can have spurious output related limitations at even 80% of the Nyquist limit. For example, a 10 GHz DDS output signal will really require a DDS that operates at a 25 GHz clock frequency or higher, making the usability quite limited for applications at higher than the 2 GHz that represents present state of the art.

Figure 3:
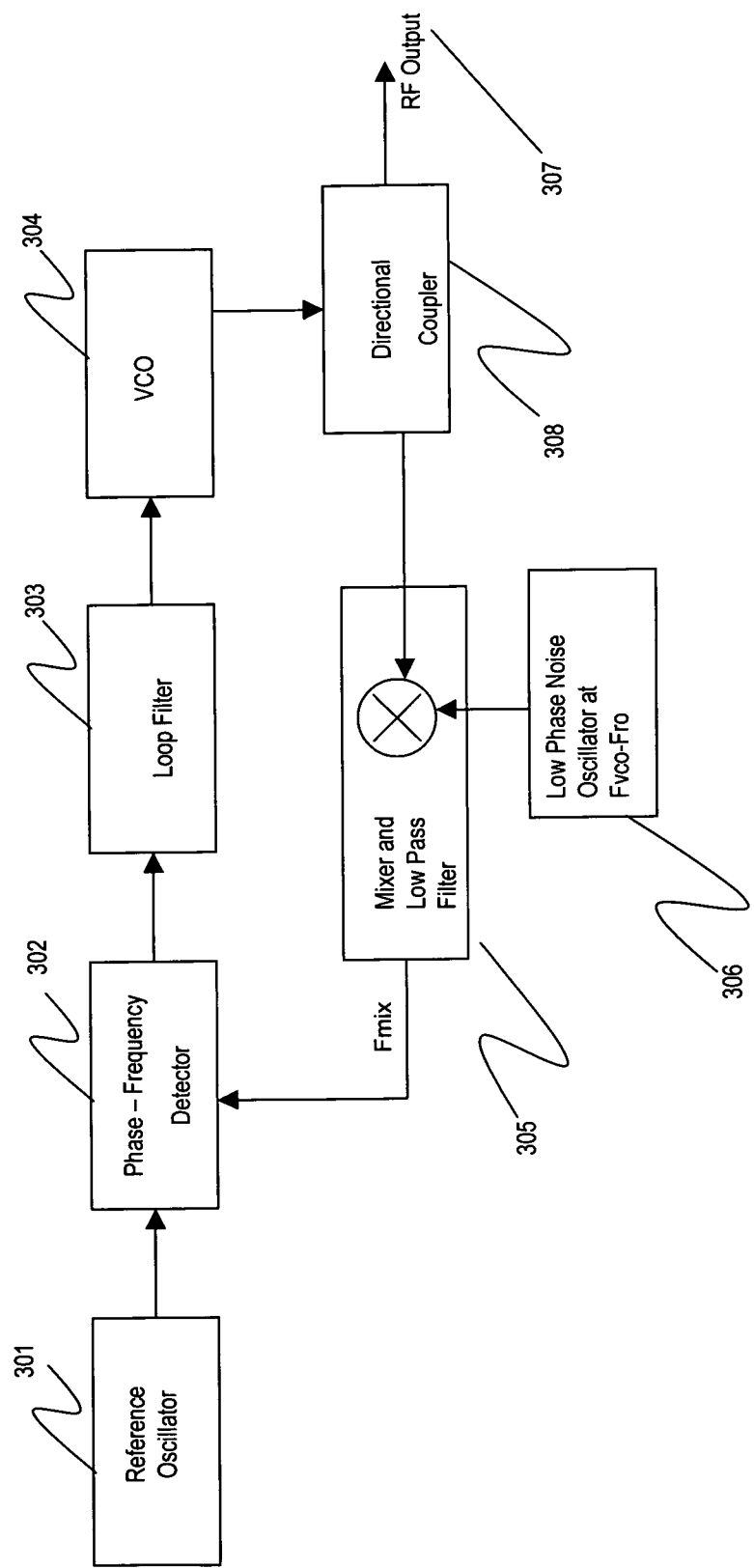
FIG. 3 shows the basic concept of a Translational synthesizer.

An idealized solution to these limitations is demonstrated in FIG. 3, which we call a Translational PLL (TPLL). If an ideal tunable very low phase noise source 306 existed, then the VCO 304 output, sampled by coupler 308 can be mixed with the signal from 306 in mixer 305 to provide a signal Fmix that would be compared with the RO 301 in the PFD 302, and with loop filter 303 effectively suppress all of the VCO 303 phase noise within the loop bandwidth. This is because Fmix now has the same phase noise characteristics as the VCO. Of course, if such an ideal low phase noise source at the VCO frequency existed, it would beg the question as to why one would need a VCO or a PLL in the first place!

Figure 4:
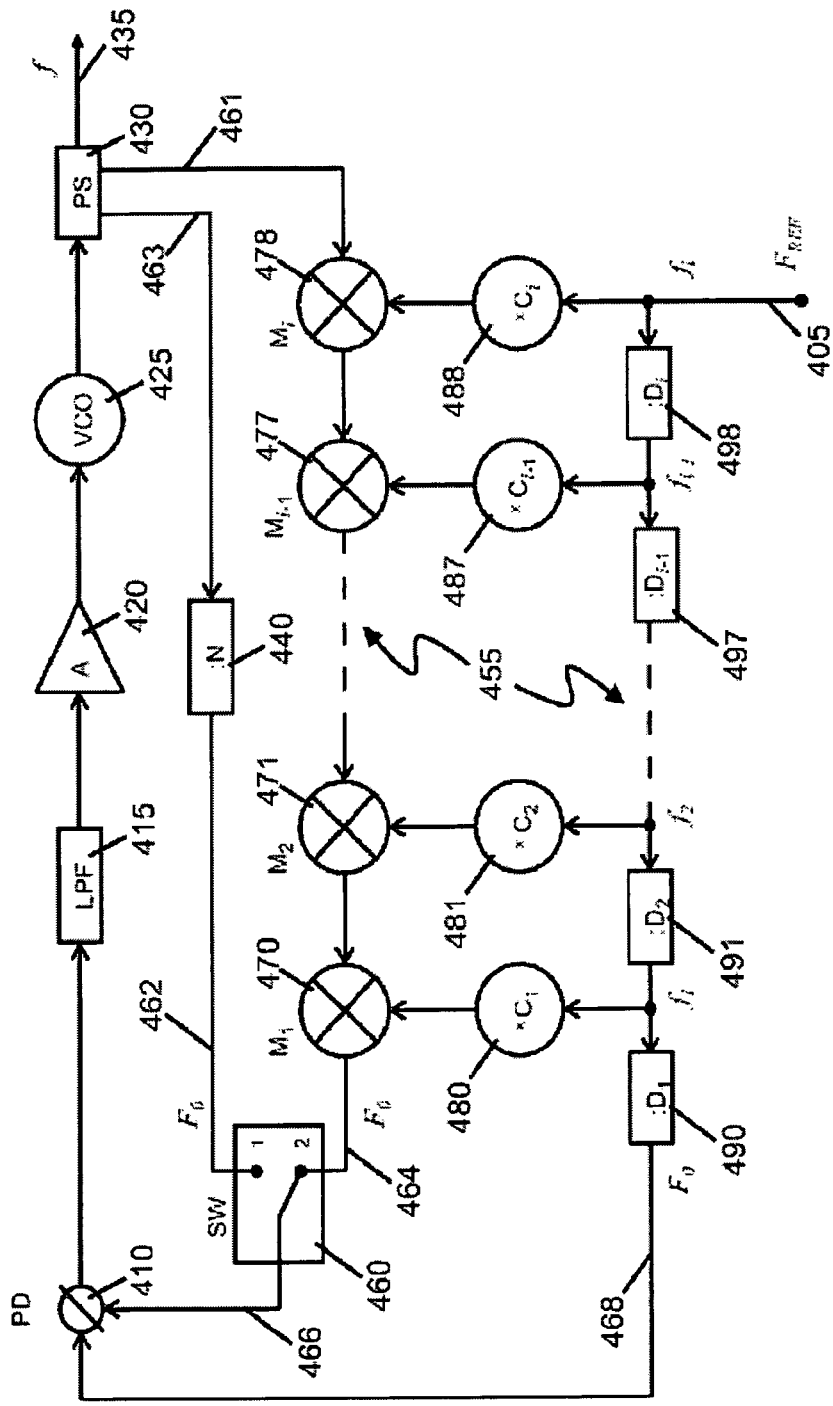
FIG. 4 shows a prior art synthesizer that attempts to solve the problem. Its shortcomings are described in greater detail.

FIG. 4 demonstrates a prior art attempt to solve the problem. This drawing is taken from FIGS. 4A and B of U.S. Pat. No. 7,701,299. A reference oscillator output 405 is continuously multiplied by a number of multipliers 480 through 488, divided by dividers 490 through 498, and mixed with the VCO output and these various multiplication and division products are mixed in mixers 470 through 478 to produce a signal 464 which can be compared to the reference 405, divided by 490 through 498 as shown. Given the number of multipliers, dividers, and mixers in the feedback path, there exist a very large number of signals close to the desired reference or RO frequency 468 at path 466. As a result, the only way this PLL can be made to work is for the PLL to be initially locked to the desired frequency via a standard divide by N PLL shown in path 463, 440 and 462, and, once stabilized, to be quickly switched over to the mixer-divider-multiplier auxiliary loop output 464. While this can be made to work, it is an expensive and highly complex process that effectively needs two full synthesizers. It can be called a Dual PLL or DPLL approach.

This DPLL creates a very complex solution to the basic problem. It requires large numbers of dividers and multipliers in order to take the reference frequency Fref to take the Fvco and create a comparison signal F0 at 464. The Fref has to be divided a number of times in dividers 490 through 498. All this complex processing, and the large number of mixers 470 through 478 are needed because a clean mixing signal is desired. But the process creates many mixer, multiplier, and divider related spurious signals (spurs), as a result of which the comparison frequency and reference frequency have many unwanted adjacent signal that could create a VCO output that is locked to the wrong mixer-multiplier product. In order to eliminate this problem, a traditional PLL has to be built, to make sure the VCO is locked to the right frequency and the switch 460 has to be very quickly switched in order not to let the VCO drift away! In addition to the cost and complexity of the process the sheer number of additional RF elements creates potential reliability issues.

The present invention creates a true Translational PLL, TPLL that overcomes all the limitations imposed by the traditional PLL, the DDS, and the DPLL. A realization of this circuit is shown in block diagram form in FIG. 5. Its operation can be described simply a follows. Let the desired output frequency be Fd, and the RO frequency be Fr. In order to achieve the desired translation we need a translational frequency Ft such that $$Ft=Fd\pm Fr$$

To generate Ft, we use a DDS at a fraction M of Ft, and mix this using a Harmonic Mixer with Fd. Here M<<N, the traditional PLL divide by number that would be used. Note that the DDS phase noise is degraded only by 20 logM. Commercially available DDS have excellent phase noise, so that its phase noise degraded by the multiplication by M is still substantially lower than the VCO phase noise. The mixer output Fm, since it mixes the VCO output Fd which is much noisier than Ft, substantially reflects the phase noise of the VCO, as the numderical example below demonstrates. As a result, the TPLL will exhibit phase noise performance within its loop bandwidth substantially closer to that of the RO and DDS, both of which can be very clean sources. Thus the VCO 504 output, sampled by coupler 505, mixed in the harmonic mixer 507 with the DDS 506 output multiplied by M and sent to the PFD 502 to be compared with the RO 501, and the result sent to the VCO 504 via the LPF 503, presents an elegant TPLL with low cost and high performance.

An example will help elucidate this. Let us say a reference frequency Fr of 10 MHz is used to phase lock a VCO at an output frequency, Fd of 12 GHz. Using the traditional PLL, within the loop, the crystal oscillator phase noise would be degraded by 61.59 (approximately 62) dB. To put it another way, the VCO phase noise is improved by 62 dB due to the division by 1200 before comparing with the RO in the traditional PLL. Consider an oven controlled crystal oscillator with a phase noise of −145 dBc 1 KHz from carrier. Commercial best VCO phase noise at 10 GHz is typically −50 dBc at a 1 KHz offset. The best a traditional PLL could do under the circumstances would be with a Fvco/N of (−50 −62) or −112 dBc, so that the actual phase noise would at best be improved by (145−112) or 23 dB, creating a best case traditional PLL phase noise of −83 dBc.

Figure 5:
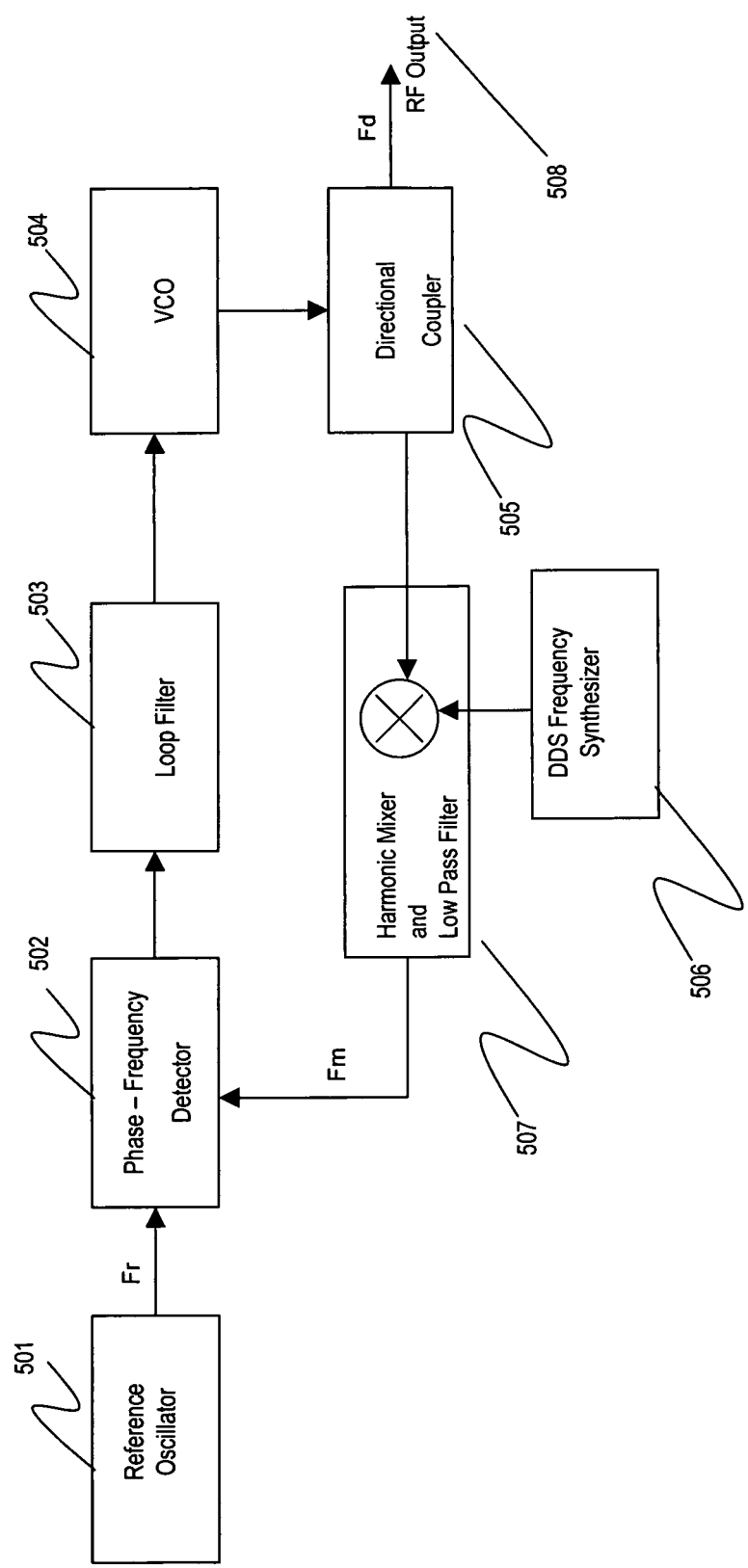
FIG. 5 shows a block diagram Translational PLL realization based upon the invention.

In the Translational PLL, of FIG. 5 the phase noise of the VCO and M times the phase noise of the DDS get added at Harmonic Mixer LPF combination 506. If the DDS is operated at 599.5 MHz, the DDS output, multiplied times 20 to get to 11,990 MHz, when mixed with the VCO signal at 12,000 MHz would produce the RO frequency of 10 MHz (12,000− 11,990). In this process, the DDS phase noise would be degraded by 26 dB. Let us now consider an example using practical state of the art commercially available components. If we chose a DDS synthesizer such as the Analog Devices AD9914 synthesizer, with a clock rate of close to 3.6 Giga Samples Per Second, (GSPS), then at 599.5 MHz the device is operating at less than one sixth the Nyquist frequency, thus with minimal spurs. The phase noise at 1 KHz offset from carrier, per the AD9914 data sheet, is −130 dBc. The 20th harmonic of the DDS, at 11,990 MHz, will have a 1 KHz offset phase noise of −104 dBc (130−20 log 20). If we use a commercially available VCO such as the DXO880920-5 VCO from Synergy Microwave for example, the VCO phase noise phase noise is −50 dBc at 1 KHz offset. When compared with the AD9914 multiplied times 20, the difference between the phase noise of the VCO and the multiplied phase noise of the DDS is (104−50), or 54 dB. Thus the VCO phase noise dominates the AD9914 phase noise by 54 dB, so the mixer output substantially reflects the VCO phase noise. Thus the noise at the input to the PFD will be dominated by the VCO noise. Assuming a 10 KHz loop bandwidth, FIG. 9, to be discussed later, shows the various phase noise outputs that can be expected.

To determine the frequency of the DDS, we note that, from equation 1, above, Fdds=Ft·M, where M is an integer. We note that Fd and M times Ft are only separated by a small number, Fr. The goal is to keep M as small as possible, in other words, to keep the DDS frequency as high as possible in order to degrade the DDS phase noise the least, so that the VCO inherent phase noise is the dominant factor for the loop to correct. If the output frequency desired, Fd is known and the reference frequency Fr is known, then, $$Fdds=\text{Absolute value of } (Fd-Fr)/M$$

where M is an integer. Since the value of M is known, and Fd and Fr are known, Fdds can be calculated to the precision required. Since most DDS synthesizers are capable of 12 bits of precision, this implies that the desired frequency output can be achieved using only Integer Synthesis, eliminating spurious signal considerations created by fractional division.

Figure 6:
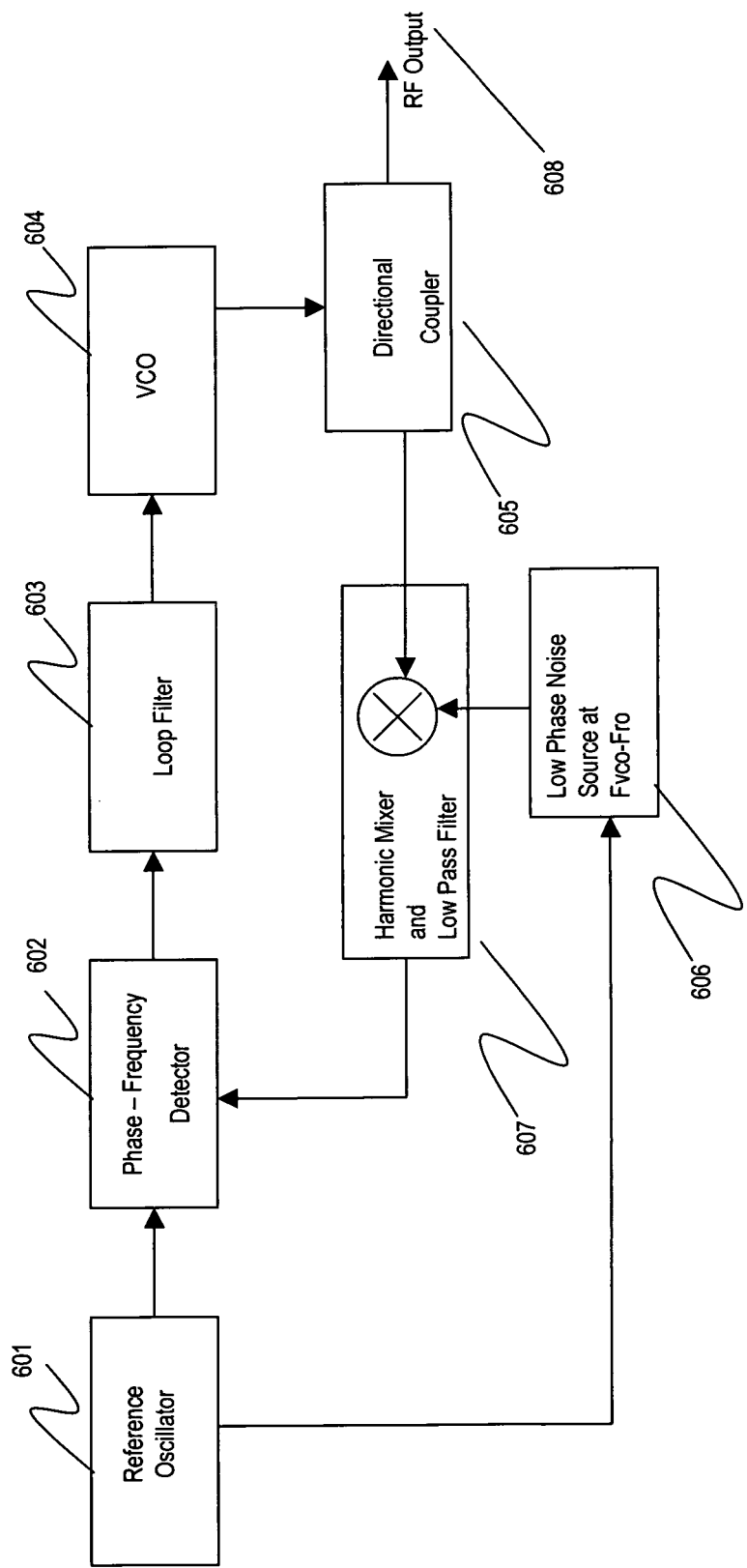
FIG. 6 shows an alternative Translational PLL approach in block diagram form.

FIG. 6 demonstrates an alternative TPLL realization. Here we replace the DDS synthesizer with a lower frequency PLL based synthesizer 606. This can, for example be a PLL that uses the fact that VCOs exist that have significantly low phase noise at lower frequencies since higher quality tuning diodes area available. Using the numerical example given above, we can possibly chose a VCO based synthesizer 606 at frequency Ftr=Fdds of FIG. 5 that can achieve PLL phase noise values of close to 110 dBc at 599.5 MHz at a 1 KHz offset from the carrier frequency. With the same 26 dB degradation due to multiplication by a factor of 20 (M=20), the low frequency synthesizer output will be 84 dBc, still 30 dB superior to the VCO 604 phase noise, and able to provide similar advantage over the traditional PLL. Using the TPLL architecture of the present patent, many such alternative synthesizer designs can be achieved using alternative Translational Mixer driving synthesizers.

Figure 7:
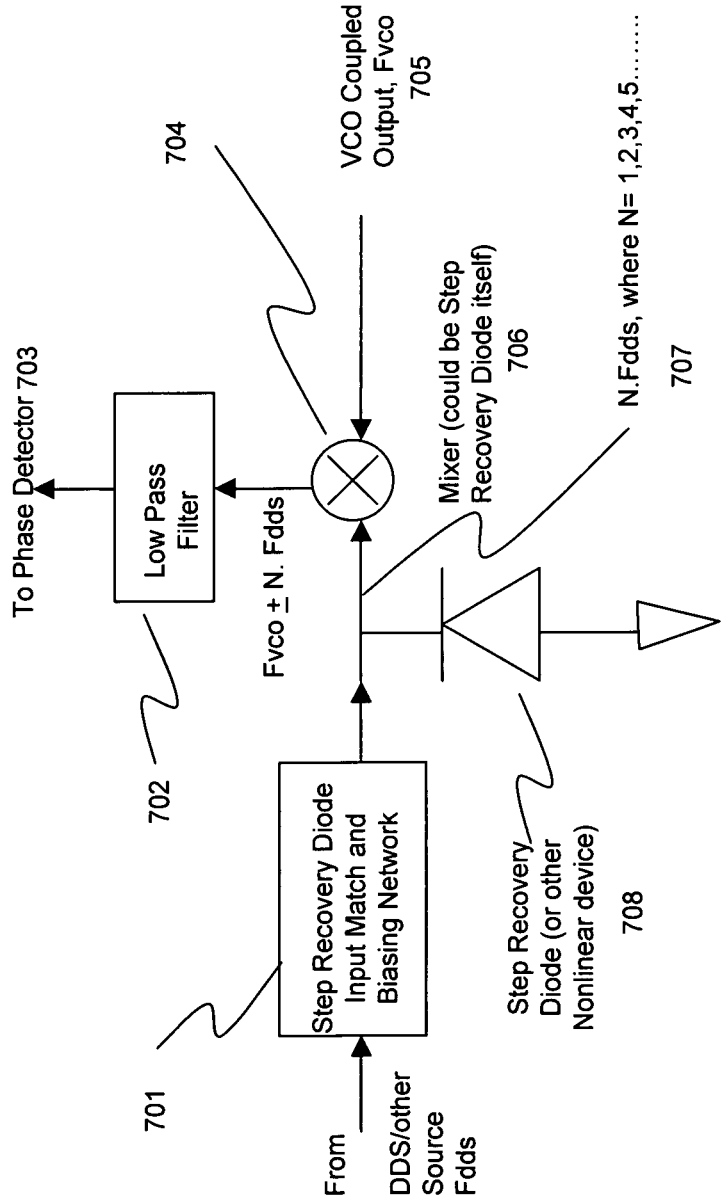

FIG. 7 shows one method of realizing a harmonic mixer. The step recovery diode, SRD, 708 has the property that when properly biased, it acts as an impulse generator. It collects all the charge over most of a single cycle acting as a short circuit, and puts out an impulse when the charge is depleted when the diode suddenly becomes an open circuit in a matter of picoseconds. Such an impulse, which happens once a cycle at the output frequency of the DDS, Fdds, is rich in harmonics, and when the VCO signal is also put across the diode, or mixed in a separate mixer 804, the result is automatically to create signals at frequencies (M·Fdds±Fd). The upper sidebands of the mixer output, being very high in frequency are easily low pass filtered using filter 702, leaving the desired translated VCO signal 703 to compare with the RO at the Phase detector.

Compared to prior art, this new invention provides significant advantages. As already pointed out it offers vastly better phase noise potential than a traditional PLL. In addition, using the modulation capabilities inherent to the DDS architecture, which will translate right through the PLL, excellent frequency and phase modulation can be delivered at practically no extra cost. The frequency and phase switching can be made phase continuous, which a divider based PLL cannot. The PLL acts at all times as an integer PLL so that there are no Fractional Spurs to worry about. And, by keeping the DDS frequencies well below the Nyquist limit, most DDS related problems are minimized.

Compared to a purely DDS synthesizer, until processing technology evolves an order of magnitude or more, the TPLL provides a much higher operating frequency range. Even as technology evolves the TPLL concept would continue to be applicable.

Compared to the DPLL, the TPLL does not need two high frequency PLLs, a full traditional PLL on top of a translational device. The complexity of a multiple-multiply-divide architecture is eliminated by having a fairly simple harmonic mixer frequency determination algorithm that can be easily implemented. This reduces size, power dissipation, locking time, locking uncertainties due to PLL switching, and a result, cost.

Figure 8:
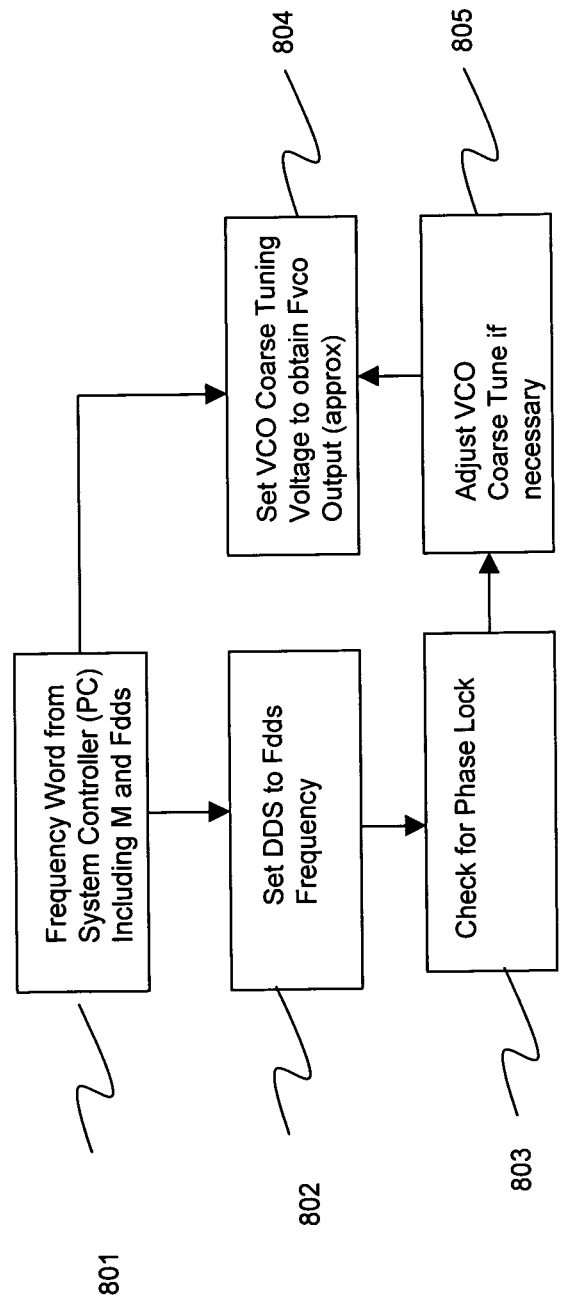
FIG. 8 shows a flow chart of the Frequency Control software that allows broad bandwidth operation.

The TPLL algorithm is shown in FIG. 8. If the reference frequency Fr is known, the VCO frequency Fvco is known, and the spurious free DDS frequency Fdds is known, then, $$M=\text{IntegerValue of } (Fvco/Fdds) \text{ so long as } Fr<<Fdds.$$

$$\text{and, } Fdds=(Fvco-Fr)/M$$

Knowing Fvco and Fr, Fdds can be easily calculated. If Fdds has only a very small range (if Fdds is obtained from a high purity low noise synthesizer rather than a true DDS), or if Fvco has a very larger range, then M will need to be continuously recalculated.

Figure 10:
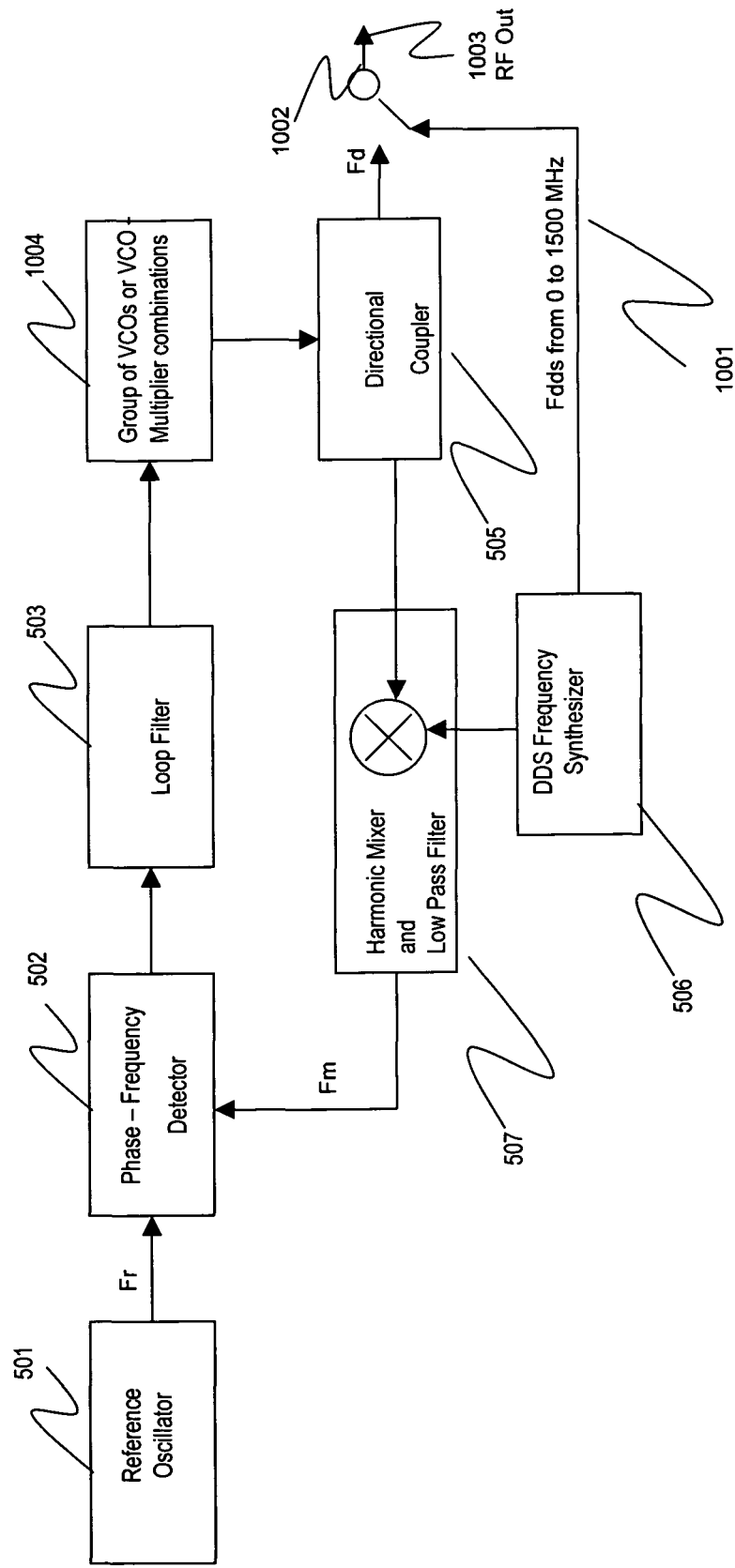
FIG. 10 shows one preferred embodiment that results in a low noise synthesizer that covers very low frequencies up to the maximum VCO frequency.

FIG. 10 shows an aspect of the invention that allows for extremely wideband instrumentation synthesizers to be realized in a way that could not be done before. It can be shown that the range of Fdds in 506 of FIG. 5 or Ftr on 606 of FIG. 6, can be much smaller than the range of the output VCO so long as M<<N is maintained in order to achieve significant phase noise improvement. If Fdds or Ftr are limited to a range of 500 MHz to 700 MHz, for example, and M is varied from 3 to 30 by choosing the appropriate harmonic in the harmonic mixer, output frequencies of 1500 MHz to 21,000 MHz can be achieved. If the DDS output is switched so as to provide a 0 to 1500 MHz DDS output, a synthesizer can be created that covers DC to 21 GHz with excellent phase noise. The range of the divide by N number in a traditional PLL from 1500 MHz to 21,000 MHz would be 150 to 2,100.

A block diagram of this is shown in FIG. 10. FIG. 10 is identical in most aspects to FIG. 5, except that the Fdds 506 output, that has a range of 0 MHz to 1500 MHz is taken via 1001 to an output switch 1002. The VCO 1004 is now a gang of VCOs that can tune from 1500 MHz to 21000 MHz or higher. The switch 1002 is then switched to obtain an output that covers DC to 21,000 MHz and beyond, with Phase noise that is very comparable to that of the reference rather than that of the VCO or its divided output.

Figure 9:
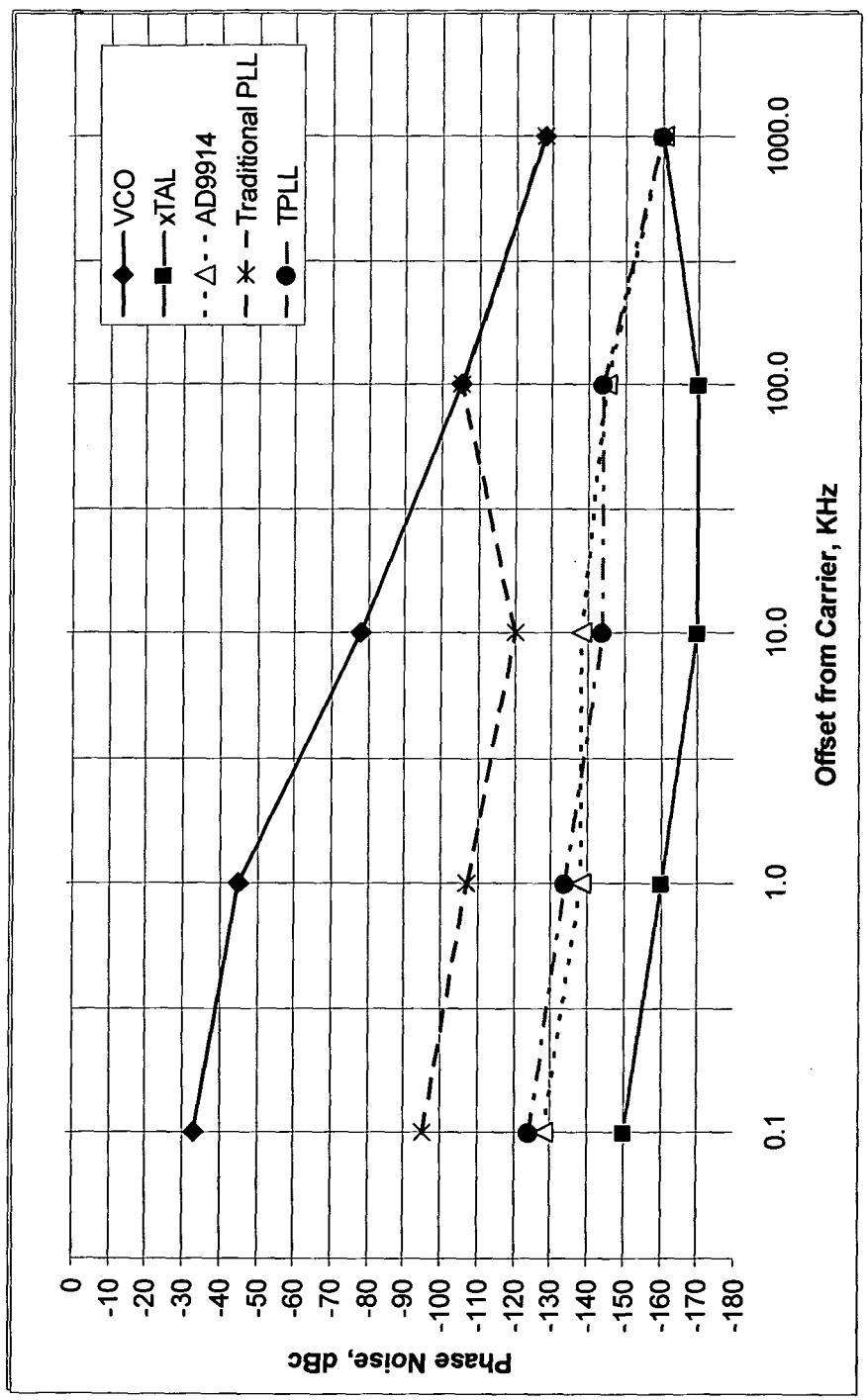
FIG. 9 shows a comparison between the phase noise of a traditional PLL and a TPLL.

FIG. 9 shows the advantage of the system in graphical format, assuming a 10 GHz output frequency. The phase noise contributions from the VCO, and the RO and the AD9914 at 10 GHz are taken into account, omitting other loop related noise parameters, to show the difference. It can be seen that the TPLL improves upon the performance of the traditional PLL by over 30 dB. This, in addition to the fact that there are no fractional spurs to contend with, no dual loop requirement, and the ability to do add all the modulation available in the DDS provide this invention a significant advantage.

We claim:

1. A frequency synthesizer circuit incorporating a Broadband Translational Phase lock Loop (BTPLL) capable of operating over multiple octaves of frequency range consisting of
   a Voltage or Current Controlled Oscillator (VCO),
   a Directional Coupler or Power Splitter that couples part of the VCO output power for the BTPLL hereinafter called the coupled output,
   a broadband Harmonic Mixer consisting of a step recovery diode impulse generator followed by a mixer that mixes the coupled output with a known Harmonic of a programmable Direct Digital Synthesizer that drives the impulse generator providing a harmonic mixer output that substantially reflects the VCO Phase Noise,
   a low pass filter that filters the desired harmonic mixer product to be presented to a phase frequency detector
   a phase frequency detector that compares the chosen harmonic mixer product with a Reference Oscillator (RO) creating an Error Signal,
   a Loop Filter circuit which incorporates a Low Pass Filter that filters the Error Signal such that the BTPLL phase noise tracks that of the RO within a desired Loop Bandwidth,
   wherein the Loop Filtered Error Signal is used to fine tune the frequency of the VCO and reduce its phase noise, thus closing the loop for the BTPLL.

2. The BTPLL of claim 1, wherein the VCO can either be voltage controlled such as with a varactor diode, or current controlled such as a YIG Tuned Oscillator or by any other means of tuning the VCO frequency.

3. The BTPLL of claim 1 wherein the Harmonic Mixer uses a Step Recovery Diode Impulse Generator as an integrated harmonic mixer device.

4. The BTPLL of claim 1 wherein the Harmonic Mixer uses a Step Recovery Diode Impulse Generator to generate the harmonics of the Mixer Reference Frequency and an external mixer that then mixes these harmonics with the coupled VCO outputs.

5. The BTPLL of claim 1 wherein the mixer reference frequency is calculated such that the low pass filtered mixer output from an integer multiple of the Mixer Reference Frequency mixed with the VCO output is equal to the Reference Oscillator frequency.

6. The BTPLL of claim 1 wherein the Mixer Reference frequency is generated from the RO by another synthesizer at a frequency higher than that of the RO and lower than that of the VCO.

7. The BTPLL of claim 1 wherein a Charge Pump is used between the Phase detector output and the Loop Filter in the loop.

8. The BTPLL of claim 1 wherein the DDS is used to Phase, Frequency modulate the BTPLL output.

9. The BTPLL of claim 1 wherein the DDS is programmed to provide phase continuous output at the BTPLL.

10. A Frequency Synthesizer that utilizes the BTPLL of claim 1 wherein the output of the output of the DDS is selected to provide the lower frequency range of the synthesizer, and includes an output switch in order to select the desired frequency output.

11. The Frequency Synthesizer of claim 10, wherein the VCO is replaced by a bank of individually switched VCOs and their harmonics so that the output frequency extends from the maximum DDS frequency to any desired output range of frequencies.

* * * * *